(12) United States Patent
Köninger et al.

(10) Patent No.: US 12,193,172 B2
(45) Date of Patent: Jan. 7, 2025

(54) ELECTRONICS HOUSING AND ASSEMBLY METHOD

(71) Applicant: Schaeffler Technologies AG & Co. KG, Herzogenaurach (DE)

(72) Inventors: Tobias Köninger, Bühl (DE); Michael Bohnert, Kappelrodeck (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 91 days.

(21) Appl. No.: 17/921,394

(22) PCT Filed: Mar. 29, 2021

(86) PCT No.: PCT/DE2021/100307
§ 371 (c)(1),
(2) Date: Oct. 26, 2022

(87) PCT Pub. No.: WO2021/219157
PCT Pub. Date: Nov. 4, 2021

(65) Prior Publication Data
US 2023/0199978 A1    Jun. 22, 2023

(30) Foreign Application Priority Data
Apr. 27, 2020   (DE) .......................... 102020111438.9

(51) Int. Cl.
*H05K 5/00*      (2006.01)
*H01R 12/58*     (2011.01)

(52) U.S. Cl.
CPC ......... *H05K 5/0069* (2013.01); *H01R 12/585* (2013.01); *H05K 5/0082* (2013.01)

(58) Field of Classification Search
CPC .. H05K 5/0069; H05K 5/0082; H01R 12/585; H01R 12/523; H01R 12/58
See application file for complete search history.

(56) References Cited

U.S. PATENT DOCUMENTS

| | | | | |
|---|---|---|---|---|
| 4,363,530 A | * | 12/1982 | Verhoeven | H01R 12/58 439/571 |
| 4,686,607 A | * | 8/1987 | Johnson | H01R 12/716 361/791 |
| 5,397,241 A | * | 3/1995 | Cox | H01R 12/737 439/63 |

(Continued)

FOREIGN PATENT DOCUMENTS

| | | |
|---|---|---|
| DE | 102005043033 | 4/2007 |
| EP | 0032781 | 7/1981 |

(Continued)

*Primary Examiner* — Rockshana D Chowdhury
*Assistant Examiner* — Martin Antonio Asmat Uceda
(74) *Attorney, Agent, or Firm* — Volpe Koenig

(57) ABSTRACT

An electronics housing (10) including a circuit board (3) that is through-plated via press-fit connections (5), and including guide pins (6, 7) extending through circuit board through-holes (8, 9) provided in the circuit board (3). In order to simplify the assembly of the electronics housing (10), the guide pins (6, 7) protrude from a first press-fit body (4) of at least one first press-fit connection (5), and a second press-fit body of at least one second press-fit connection is guided onto the guide pins (6, 7) of the first press-fit body (4) on a side of the circuit board (3) facing away from the first press-fit body (4).

17 Claims, 2 Drawing Sheets

(56) References Cited

U.S. PATENT DOCUMENTS

| | | | | |
|---|---|---|---|---|
| 5,707,242 | A | * | 1/1998 | Mitra ................ H01R 12/7076 |
| | | | | 439/74 |
| 8,523,611 | B2 | * | 9/2013 | Pan .................... H01R 13/6658 |
| | | | | 439/620.22 |
| 2002/0195271 | A1 | | 12/2002 | Gailus |
| 2018/0076541 | A1 | * | 3/2018 | Matoy ................. H01R 12/585 |

FOREIGN PATENT DOCUMENTS

| | | | |
|---|---|---|---|
| JP | 2006081309 | 3/2006 | |
| WO | WO-2007028671 A1 * | 3/2007 | ............. H01R 9/091 |

\* cited by examiner

ELECTRONICS HOUSING AND ASSEMBLY METHOD

CROSS-REFERENCE TO RELATED APPLICATIONS

This application is the U.S. National Phase of PCT Appln. No. PCT/DE2021/100307, filed Mar. 29, 2021, which claims the benefit of German Patent Appln. No. 10 2020 111 438.9, filed Apr. 27, 2020, the entire disclosures of which are incorporated by reference herein.

TECHNICAL FIELD

The disclosure relates to an electronics housing comprising a circuit board that is through-plated via press-fit connections, and comprising guide pins extending through circuit board through-holes provided in the circuit board. The disclosure also relates to a method for assembling such an electronics housing.

BACKGROUND

From the German patent specification DE 10 2005 043 033 B3 a press-fit system for electrical contacting of electrical carrier components in an electronics housing is known, wherein the system comprises press-fit pins which can be pressed into an electrical carrier component via a press-fit tool, and at least one counterholding tool which is integrated so as to remain fixed in the electronics housing, wherein the counterholding tool has guide pins which engage in a blind hole-like recess for fixed positioning of the counterholding tool, wherein the electronics housing comprises a housing base and a housing cover, which has anchoring pins which open into a circumferential groove of the housing base.

SUMMARY

It is the object of the disclosure to simplify the assembly of an electronics housing comprising a circuit board that is through-plated via press-fit connections, and comprising guide pins extending through circuit board through-holes provided in the circuit board.

The object is achieved with an electronics housing comprising a circuit board that is through-plated via press-fit connections and comprising guide pins extending through circuit board through-holes provided in the circuit board, in that the guide pins protrude from a first press-fit body of at least one first press-fit connection, wherein a second press-fit body of at least one second press-fit connection is guided onto the guide pins of the first press-fit body on a side of the circuit board facing away from the first press-fit body. The first press-fit connection is joined from below, for example. Then the second press-fit connection is joined from above. The second press-fit body can be guided directly or indirectly on the guide pins of the first press-fit body. This means that the second press-fit body can include guide recesses with which the second press-fit body is guided directly on the guide pins of the first press-fit body. However, the guide recesses for guiding the second press-fit body on the guide pins of the first press-fit body can also be provided in a housing part that is combined with the second press-fit body. Among other things, the claimed electronics housing provides the advantage that only two circuit board through-holes are required in the circuit board for the two press-fit bodies.

A preferred exemplary embodiment of the electronics housing is characterized in that the press-fit connections are joined to the press-fit bodies from opposite sides of the circuit board. For the manufacture of press-fit connections, counterholders can be used in a manner known per se. However, these counterholders do not remain in the electronics housing.

A further preferred exemplary embodiment of the electronics housing is characterized in that the second press-fit body is combined with a housing part which has guide recesses for the guide pins of the first press-fit body. This simplifies handling of the second press-fit body during assembly of the electronics housing.

A further preferred exemplary embodiment of the electronics housing is characterized in that the circuit board is fixed between two housing parts. This simplifies the assembly of the circuit board with the press-fit bodies in the electronics housing.

A further preferred exemplary embodiment of the electronics housing is characterized in that the first press-fit body is fixed between the circuit board and one of the housing parts. Advantageously, the same mounting means can be used both for mounting the two housing parts to one another and for fixing the first press-fit body and the circuit board.

A further preferred exemplary embodiment of the electronics housing is characterized in that a plug connection is arranged between the guide recesses on one of the housing parts. For example, the plug connection is electrically connected to the circuit board via the second press-fit body. This simplifies the design of the plug connection on the electronics housing.

In a method for assembling an electronics housing described above, the object stated above is alternatively or additionally achieved in that the first press-fit body with the guide pins and the at least one first press-fit connection is joined through the circuit board from one side, before the second press-fit body with the at least one second press-fit connection is joined through the circuit board from the opposite side, wherein the second press-fit body is guided onto the guide pins of the first press-fit body. This greatly simplifies the manufacture of the press-fit connections.

A preferred exemplary embodiment of the method is characterized in that an assembly unit consisting of the circuit board and the press-fit bodies with the joined press-fit connections is assembled with at least one housing part. After that, this assembly unit can then simply be assembled with the second housing part to complete the electronics housing.

The disclosure further relates to an assembly unit comprising a circuit board and two press-fit bodies with press-fit connections for an electronics housing described above. The assembly unit can be dealt with separately.

The disclosure further relates to a press-fit body, a circuit board and/or a housing part for an electronics housing described above. The parts mentioned can be dealt with separately.

A further preferred exemplary embodiment of the electronics housing is characterized in that an assembly protrusion is formed between the guide pins on a side facing away from the guide pins on the press-fit body, which comprises the press-fit connection and engages in an assembly recess of a housing body. The housing body represents a vehicle-side first housing part. The assembly protrusion engaging in the assembly recess considerably simplifies the positioning of the press-fit body, preferably together with the circuit board.

A further preferred exemplary embodiment of the electronics housing is characterized in that a plug connection region is arranged between the guide pins on a housing cover. The housing cover represents a second housing part. The electronics housing or the circuit board in the electronics housing can be connected to another vehicle-side component via the plug connection region.

A further preferred exemplary embodiment of the electronics housing is characterized in that the plug connection region is positioned between two parallel longitudinal axes of the guide pins. The guide pins, for example, are essentially in the form of straight circular cylinders, which can be designed to be stepped. The longitudinal axes of the guide pins are preferably arranged perpendicular to the circuit board and the press-fit body. The preferably central arrangement of the plug connection region between the longitudinal axes of the guide pins increases the stability of the plug connection region provided on the outside of the housing cover.

A further preferred exemplary embodiment of the electronics housing is characterized in that the circuit board through-holes are arranged between two mounting through-holes in the circuit board. In this manner, stable fixation of the circuit board can thus be easily achieved. Additional anchoring pins can advantageously be dispensed with.

A further preferred exemplary embodiment of the electronics housing is characterized in that the guide pins are arranged along a straight line between two mounting through-holes in the circuit board. This allows the circuit board to be mounted in the electronics housing in a stable and space-saving manner.

A further preferred exemplary embodiment of the electronics housing is characterized in that multiple press-fit connections are arranged in a row transverse to the straight line between the two mounting through-holes in the circuit board. This simplifies the manufacture of the press-fit connections.

A further preferred exemplary embodiment of the electronics housing is characterized in that the housing cover has a mounting flange with two mounting through-holes for mounting means, which are arranged coaxially with the mounting through-holes in the circuit board and coaxially with mounting through-holes in the press-fit body. The mounting means are, for example, mounting screws. The claimed arrangement of mounting through-holes simplifies both the manufacture as well as assembly of the electronics housing.

A further preferred exemplary embodiment of the electronics housing is characterized in that the housing cover is mounted to one or the housing body with screws that are screwed into threaded holes of the housing body through the mounting flange, through the circuit board and through the press-fit body. The screw heads are advantageously easily accessible on the outside of the mounting flange with a mounting tool. The screws advantageously fix four parts relative to one another, namely the housing cover, the circuit board, the press-fit body and the housing body. The circuit board and the press-fit body are advantageously clamped between the housing cover and the housing body. This reliably prevents undesired relative movements of the four parts mentioned above after assembly.

BRIEF DESCRIPTION OF THE DRAWINGS

Further advantages, features and details of the disclosure will be apparent from the following description, in which various exemplary embodiments are described in detail with reference to the drawing. In the figures.

DETAILED DESCRIPTION

Figure 1:
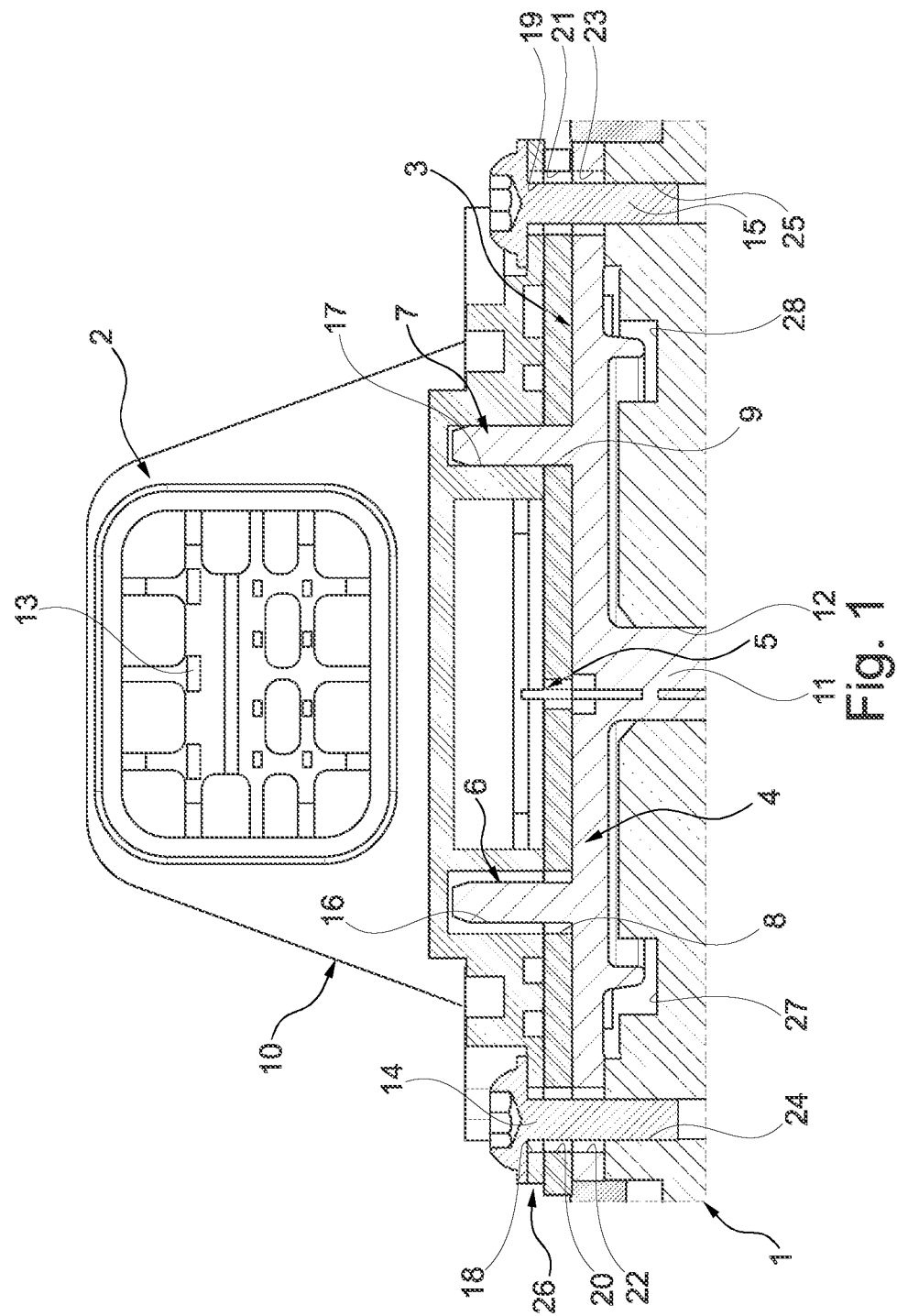
FIG. 1 shows a section of an electronics housing through a circuit board with a press-fit connection and with two guide pins.

FIG. 1 shows a sectional view of an electronics housing 10 with two housing parts 1, 2. The housing part 1 arranged at the bottom in FIG. 1 is cut off at the bottom and represents, for example, a housing body mounted on a drive train component, such as a transmission, in a motor vehicle.

The housing part 2 arranged at the top in FIG. 1 is a housing cover with a plug connection region 13. The electronics housing 10 can be connected to a further vehicle component (not shown in FIG. 1) via the plug connection region 13, which is used, for example, to insert a corresponding plug.

A circuit board 3 is arranged in the electronics housing 10. The circuit board 3 is combined with a press-fit body 4. A press-fit connection 5 is inserted into the circuit board 3 in a manner known per se. The press-fit connection 5 is one of multiple press-fit connections shown in FIG. 1 arranged side by side in a row extending perpendicular to the drawing plane of FIG. 1.

The press-fit connection 5 is arranged in a horizontal direction in FIG. 1 between two guide pins 6, 7 which extend from the press-fit body 4 in FIG. 1 in a vertical direction parallel to one another from bottom to top. The guide pins are essentially in the form of straight circular cylinders.

The press-fit connection 5 is arranged approximately in the middle of the two guide pins 6, 7. As can be seen in FIG. 1, the plug connection region 13 is arranged above the guide pins 6, 7 and above the press-fit connection 5. The plug connection region 13 on the housing cover 2 is arranged centrally between two parallel longitudinal axes of the guide pins 6, 7.

The guide pins 6, 7 are integrally connected to the press-fit body 4 and extend through circuit board through-holes 8, 9 in the circuit board 3. On a side facing away from the guide pins 6, 7, the press-fit body 4 has an assembly protrusion 11 projecting downwards in FIG. 1, which engages in an assembly recess 12 provided for this purpose in the housing body 1.

The housing cover 2, the circuit board 3 and the press-fit body 4 are mounted by means of screws 14, 15 screwed into threaded holes 24, 25 in the housing body 1, namely in FIG. 1 from above. The housing body 1 includes two deepenings 27, 28 between the assembly recess 12 and the threaded holes 24, 25, which are designed, for example, as threaded holes, for corresponding extensions of the press-fit body 4.

The guide pins 6, 7 engage above the circuit board 3 in guide recesses 16, 17 provided for this purpose in the housing cover 2. Particularly advantageously, only the two circuit board through-holes 8, 9 in the circuit board 3 are required for the two guide pins 6, 7. Advantageously, no guide pins are required on the housing cover 2.

The two guide pins 6, 7 are used to effectively position the press-fit body 4, the housing cover 2 and the circuit board 3 arranged between them with the circuit board through-holes 8, 9. The mounting relative to one another is implemented by means of screws 14, 15.

For this purpose, the housing cover 2 is equipped with a mounting flange 26, which has two mounting through-holes 18, 19 for the screws 14, 15. Coaxial mounting through-holes 20, 21; 22, 23 are provided in the circuit board 3 and in the press-fit body 4 for the mounting screws 14, 15.

The guide pins 6, 7 are advantageously used to first position the press-fit body 4 relative to the circuit board 3 during assembly, wherein the press-fit connection 5 or multiple press-fit connections can be made simultaneously. Advantageously, the press-fit body 4 can be positioned relative to the housing body 1 with the assembly protrusion 11 in the assembly recess 12 before this operation.

The housing cover 2 can then be positioned using the guide pins 6, 7 and fixed in place using the screws 14, 15. At the same time, the circuit board 3 and the press-fit body 4 are fixed between the two housing parts 1, 2.

Figure 2:
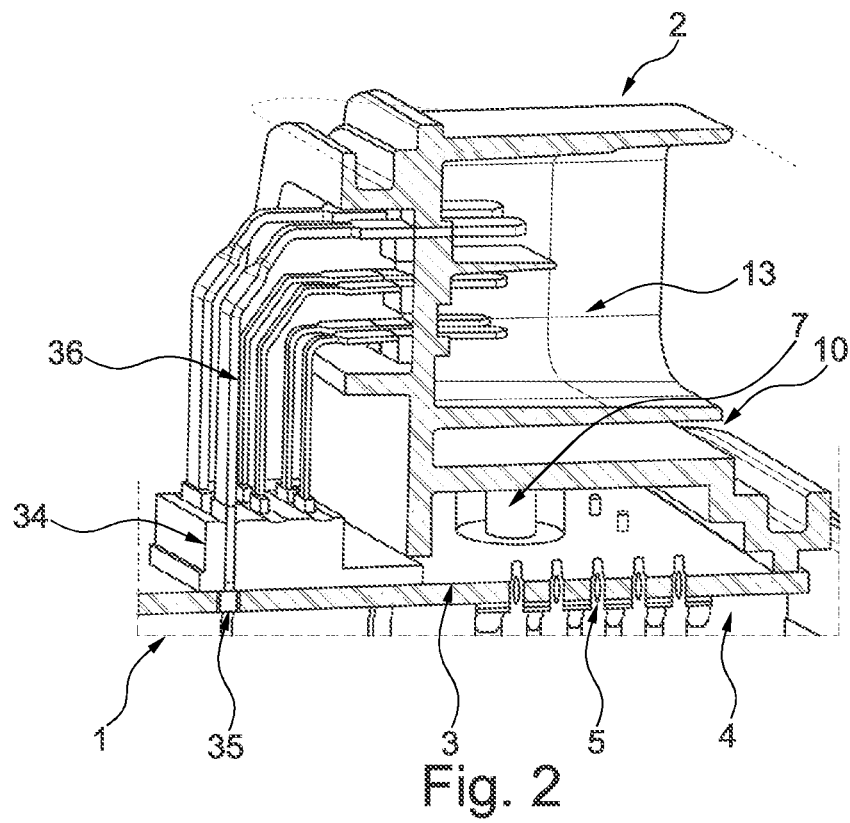
FIG. 2 is a perspective view of a section through a housing part that is combined with a second press-fit body.

In FIG. 2, it can be seen that a second press-fit body 34 is arranged in the electronics housing 10 in addition to the press-fit body 4, which is also referred to as the first press-fit body 4. The second press-fit body 34 is used to represent a second press-fit connection 35, which is joined to the circuit board 3 from above in FIG. 2.

The second press-fit body 34 is connected to the plug connection region 13 via connection lines 36. In this regard, the second press-fit body 34 is mounted to the housing part 2 of the electronics housing 10. Advantageously, the guide pins 6, 7 of the first press-fit body 4 can be used for guiding of the second press-fit body 34 during assembly.

Figure 3:
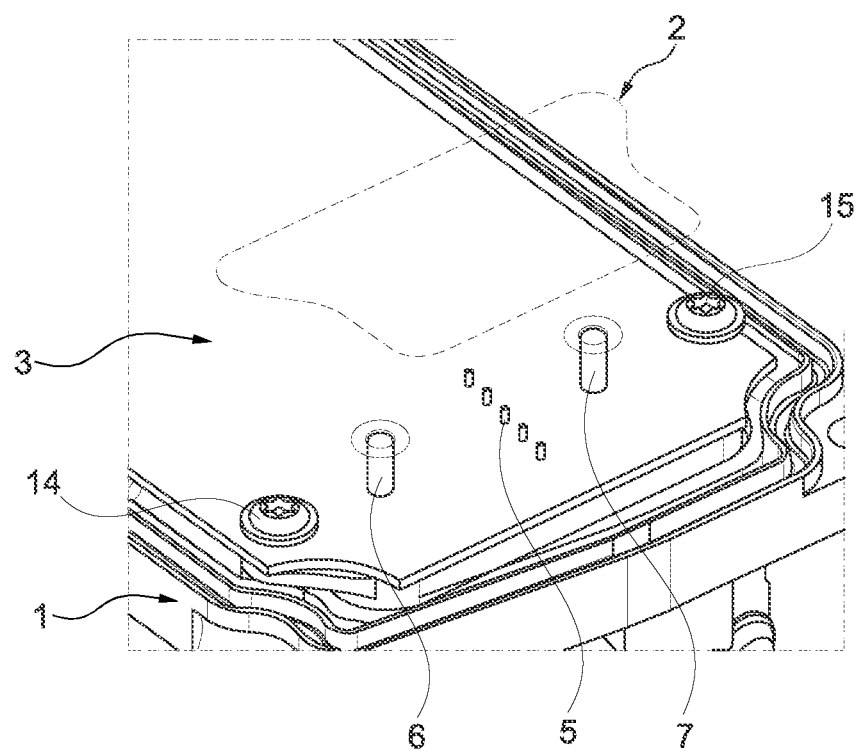
FIG. 3 is a partially transparent view of the electronics housing to illustrate the two guide pins protruding from a first press-fit body and projecting upward from the circuit board in the electronics housing.

In FIG. 3, a partially transparent view of the housing part 2 illustrates how the guide pins 6, 7 project upward from the circuit board 3. When assembling the electronics housing 10, the housing part 2 is pre-assembled with the second press-fit body 34 on the circuit board 3 to make the second press-fit connection 35.

The first press-fit connection 5 has advantageously already been mounted on the circuit board 3 from below with the first press-fit body 4 in FIG. 2. The housing part 2 is then advantageously assembled together with the already pre-assembled press-fit bodies 4, 5 and the circuit board 3 with the housing part 1 to complete the electronics housing 10.

LIST OF REFERENCE SYMBOLS

1 Housing part
2 Housing part
3 Circuit board
4 First press-fit body
5 Second press-fit connection
6 Guide pin
7 Guide pin
8 Circuit board through-hole
9 Circuit board through-hole
10 Electronics housing
11 Assembly protrusion
12 Assembly recess
13 Plug connection region
14 Screw
15 Screw
16 Guide recess
17 Guide recess
18 Mounting through-hole
19 Mounting through-hole
20 Mounting through-hole
21 Mounting through-hole
22 Mounting through-hole
23 Mounting through-hole
24 Threaded hole
25 Threaded hole
26 Mounting flange
27 Deepening
28 Deepening
34 Second press-fit body
35 Second press-fit connection
36 Connection lines

The invention claimed is:

1. An electronics housing, comprising:
a circuit board that is contacted via press-fit connections;
guide pins extending through circuit board through-holes provided in the circuit board;
the guide pins protrude from a first press-fit body that includes at least a first one of the press-fit connections; and
a second press-fit body that includes at least a second one of the press-fit connections is guided onto the guide pins of the first press-fit body on a side of the circuit board facing away from the first press-fit body;
wherein each of the circuit board, the first press-fit body, and the second press-fit body include at least one through hole for receiving at least one fastener, and the at least one fastener secures the circuit board, the first press-fit body, and the second press-fit body to a first housing part.

2. The electronics housing according to claim 1, wherein the first and second press-fit connections are joined to the press-fit bodies from opposite sides of the circuit board.

3. The electronics housing according to claim 1, wherein the second press-fit body is combined with a second housing part which has guide recesses for the guide pins of the first press-fit body.

4. The electronics housing according to claim 3, wherein the circuit board is fixed between the second housing part and the first housing part.

5. The electronics housing according to claim 4, wherein the first press-fit body is fixed between the circuit board and the first housing part.

6. The electronics housing according to claim 4, further comprising a plug connection arranged between the guide recesses on the second housing part.

7. A method for assembling an electronics housing according to claim 1, the method comprising:
joining the first press-fit body with the guide pins and the at least one first press-fit connection through the circuit board from one side, before joining the second press-fit body with the at least one second press-fit connection through the circuit board from an opposite side, and guiding the second press-fit body onto the guide pins of the first press-fit body.

8. The method according to claim 7, further comprising assembling an assembly unit including the circuit board and the press-fit bodies with the joined press-fit connections with the first housing part.

9. An electronics housing, comprising:
a circuit board that is contacted via press-fit connections;
guide pins extending through circuit board through-holes provided in the circuit board;
the guide pins protrude from a first press-fit body that includes at least a first one of the press-fit connections; and
a second press-fit body located on a side of the circuit board facing away from the first press-fit body, the second press-fit body including at least a second one of the press-fit connections and guide recesses which receive the guide pins of the first press-fit body, such that distal ends of the guide pins are prevented from protruding through the guide recesses.

10. The electronics housing according to claim 9, wherein the first and second press-fit connections are joined to the press-fit bodies from opposite sides of the circuit board.

11. The electronics housing according to claim 9, wherein the second press-fit body is combined with a housing part which has the guide recesses for the guide pins of the first press-fit body.

12. The electronics housing according to claim 11, wherein the circuit board is fixed between the housing part and a further housing part.

13. The electronics housing according to claim 12, wherein the first press-fit body is fixed between the circuit board and one of the housing parts.

14. The electronics housing according to claim 12, further comprising a plug connection arranged between the guide recesses on one of the housing parts.

15. The electronics housing according to claim 1, wherein the at least one fastener comprises at least one screw.

16. The electronics housing according to claim 15, wherein the at least one screw is configured to thread into the first housing part.

17. The electronics housing according to claim 1, wherein the at least one fastener is positioned further from a center of the circuit board than the guide pins.

\* \* \* \* \*